(12) United States Patent
Arai et al.

(10) Patent No.: US 7,755,870 B2
(45) Date of Patent: Jul. 13, 2010

(54) SEMICONDUCTOR INTEGRATED CIRCUIT DEVICE (75) Inventors: Katsuya Arai, Kyoto (JP); Toshihiro Kogami, Kyoto (JP); Hiroaki Yabu, Kyoto (JP)

(73) Assignee: Panasonic Corporation, Osaka (JP)

( * ) Notice: Subject to any disclaimer, the term of this patent is extended or adjusted under 35 U.S.C. 154(b) by 6 days.

(21) Appl. No.: 11/543,222

(22) Filed: Oct. 5, 2006

(65) Prior Publication Data
US 2007/0201175 A1   Aug. 30, 2007

(30) Foreign Application Priority Data
Feb. 28, 2006   (JP) ............... 2006-051794

(51) Int. Cl.
*H02H 3/22* (2006.01)
(52) U.S. Cl. ........................ 361/56; 361/111
(58) Field of Classification Search ............... 361/56, 361/111
See application file for complete search history.

(56) References Cited
U.S. PATENT DOCUMENTS

| | | | | |
|---|---|---|---|---|
| 4,989,057 A * | 1/1991 | Lu | ............... | 257/357 |
| 5,608,594 A * | 3/1997 | Fukuda | ............... | 361/58 |
| 5,751,525 A * | 5/1998 | Olney | ............... | 361/56 |
| 6,414,831 B1 * | 7/2002 | Orchard-Webb | ............ | 361/111 |
| 6,671,146 B1 * | 12/2003 | Hashimoto et al. | ............ | 361/56 |
| 6,861,680 B2 * | 3/2005 | Ker et al. | ............... | 257/199 |
| 7,233,467 B2 * | 6/2007 | Mergens et al. | ............... | 361/56 |
| 2003/0071311 A1 * | 4/2003 | Arai et al. | ............... | 257/360 |

OTHER PUBLICATIONS

Albert Z.H. Wang, "On-Chip ESD Protection for Integrated Circuits," 2002, pp. 54-57, Kluwer Academic Publishers.

* cited by examiner

*Primary Examiner*—Danny Nguyen
(74) *Attorney, Agent, or Firm*—McDermott Will & Emery LLP (57) ABSTRACT The semiconductor integrated circuit device includes: a circuit to be protected connected between a power supply line and a ground line; a first resistance connected to an external input terminal at one terminal and to an input terminal of the circuit to be protected at the other terminal; a first electrostatic discharge protection circuit including a first voltage drop circuit connected to the power supply line at one terminal and to the input terminal of the circuit to be protected at the other terminal; and a second electrostatic discharge protection circuit including a second voltage drop circuit connected to the input terminal of the circuit to be protected at one terminal and to the ground line at the other terminal.

25 Claims, 4 Drawing Sheets

SEMICONDUCTOR INTEGRATED CIRCUIT DEVICE

CROSS-REFERENCE TO RELATED APPLICATIONS

This application claims priority under 35 U.S.C. §119 on Patent Application No. 2006-51794 filed in Japan on Feb. 28, 2006, the entire contents of which are hereby incorporated by reference.

BACKGROUND OF THE INVENTION

The present invention relates to a semiconductor integrated circuit device having an electrostatic discharge (ESD) protection circuit, and more particularly, to a semiconductor integrated circuit device having an ESD protection circuit on its input side.

In recent years, semiconductor integrated circuit devices have been increasingly highly integrated in response to the progress in technologies for achieving scaling down and higher density in the process field. With the achievement of higher integration, semiconductor integrated circuits have become more susceptible to damages due to electrostatic discharge (hereinafter, called surges). For example, elements constituting an input circuit, an output circuit, an input/output (I/O) circuit, an internal circuit and the like are increasingly likely to be broken down, or degraded in performance, due to a surge intruding via a pad for external connection. To overcome this problem, semiconductor integrated circuits are provided with an electrostatic discharge (ESD) protection circuit for protecting such an input circuit, an output circuit, an I/O circuit, an internal circuit and the like from a surge.

Figure 7:
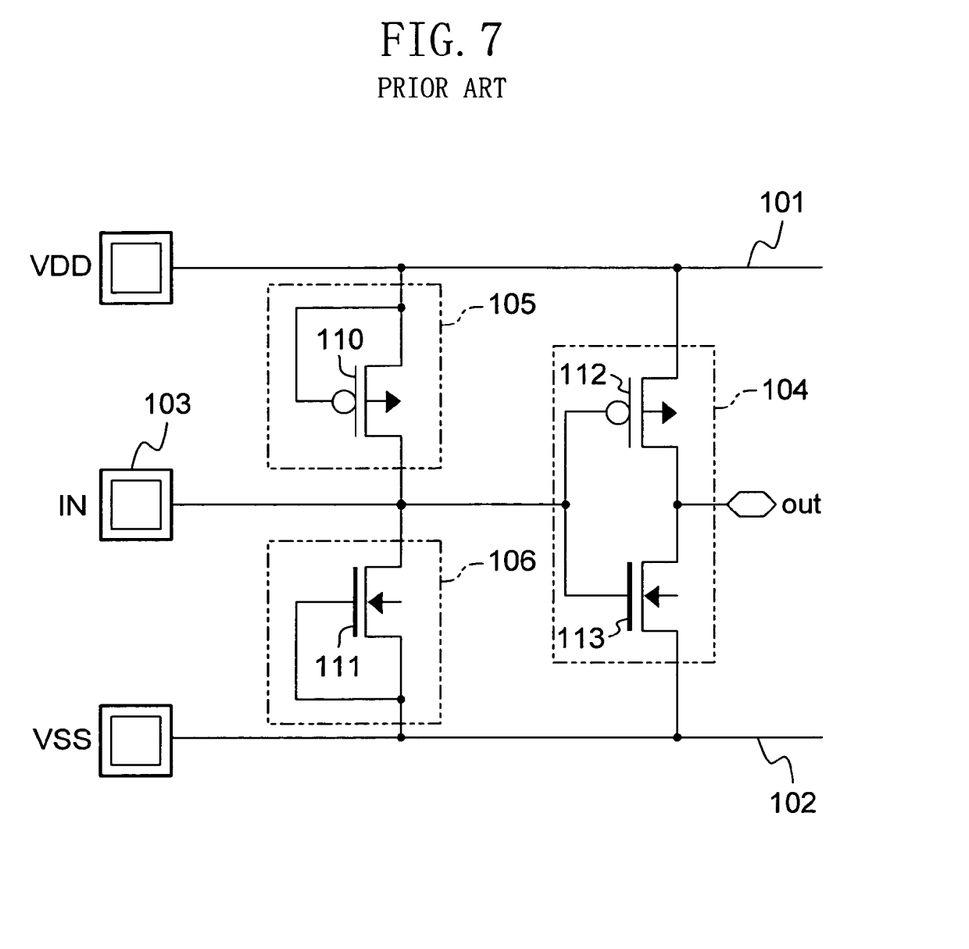
FIG. 7 is a circuit diagram of a conventional semiconductor integrated circuit device having ESD protection circuits.

FIG. 7 shows a circuit configuration of a conventional semiconductor integrated circuit device having ESD protection circuits (see Albert Z. H. Wang, "ON-CHIP ESD PROTECTION FOR INTEGRATED CIRCUITS", Kluwer Academic Publishers, 2002, for example). As shown in FIG. 7, the conventional semiconductor integrated circuit device includes: a circuit 104 to be protected having an input circuit function, including an inverter that receives power supply from a power supply line 101 and a ground (GND) line 102 and is connected to an input pad 103 at its input terminal; a first ESD protection circuit 105 connected between the power supply line 101 and the input pad 103; and a second ESD protection circuit 106 connected between the input pad 103 and the GND line 102.

The first ESD protection circuit 105 has a p-type metal oxide semiconductor (PMOS) transistor 110 whose source and gate are connected to the power supply line 101 and whose drain is connected to the input pad 103, configured to allow a surge intruding via the input pad 103 to flow to the power supply line 101 to thereby protect the circuit 104 to be protected from the surge.

The second ESD protection circuit 106 has an n-type metal oxide semiconductor (NMOS) transistor 111 whose source and gate are connected to the GND line 102 and whose drain is connected to the input pad 103, configured to allow a surge intruding via the input pad 103 to flow to the GND line 102 to thereby protect the circuit 104 to be protected from the surge.

The circuit 104 to be protected has a PMOS transistor 112 whose source is connected to the power supply line 101, whose drain is connected to the output terminal of the circuit 104 to be protected and whose gate is connected to the input pad 103, and an NMOS transistor 113 whose source is connected to the GND line 102, whose drain is connected to the output terminal of the circuit 104 to be protected and whose gate is connected to the input pad 103.

In the conventional semiconductor integrated circuit configured as described above, a positive surge (plus surge) that intrudes from outside via the input pad 103 and flows between the input pad 103 and the GND line 102 can be allowed to escape to the GND line 102 with occurrence of breakdown of the NMOS transistor 111 constituting the second ESD protection circuit 106, to thereby protect the device 104 to be protected.

Reversely, a negative surge (minus surge) that intrudes from outside via the input pad 103 and flows between the input pad 103 and the power supply line 101 can be allowed to escape to the input pad 103 with occurrence of breakdown of the PMOS transistor 110 constituting the first ESD protection circuit 104, to thereby protect the device 104 to be protected.

However, the conventional semiconductor integrated circuit device having ESD protection circuits described above has the following problem. If a plus surge is applied to the input pad 103 while the GND line 102 is grounded, for example, the circuit 104 to be protected may be broken down due to scaling down in the semiconductor fabrication process.

The reason is that, with scaling down in the process, the gate oxide film of each MOS transistor included in the circuit 104 to be protected is thinned and thus decreases in withstand voltage. Therefore, the breakdown voltage of the NMOS transistor 111 in the second ESD protection circuit 106 may become higher than the withstand voltage of the gate oxide film of the NMOS transistor 113 in the circuit 104 to be protected.

In other words, the potential of the input pad 103 may exceed the withstand voltage of the gate oxide film of the NMOS transistor 113 in the circuit 104 to be protected before the NMOS transistor 111 in the second ESD protection circuit 106 is turned ON, and this may result in breakdown of the gate oxide film of the NMOS transistor 113 in the circuit 104 to be protected. Likewise, the PMOS transistor 112 in the protected circuit 104 may possibly be broken down if a negative surge is applied to the input pad 103 while the power supply line 101 is grounded.

SUMMARY OF THE INVENTION

An object of the present invention is providing a semiconductor integrated circuit device having an ESD protection capability that satisfies surge test standards in response to scaling down in the process.

To attain the object described above, according to the present invention, a semiconductor integrated circuit device is configured to use, for an electrostatic discharge protection circuit, a voltage drop circuit that drops and alleviates the voltage input into a circuit to be protected only during application of electrostatic discharge (ESD). With this configuration, the voltage input into the circuit to be protected during application of ESD can be made lower than the withstand voltage of the gate insulating film of a MOS transistor or a metal insulator semiconductor (MIS) transistor.

The first semiconductor integrated circuit device of the present invention includes: a circuit to be protected connected between a power supply line and a ground line; a first resistance connected to an external input terminal at one terminal and to an input terminal of the circuit to be protected at the other terminal; a first electrostatic discharge protection circuit including a first voltage drop circuit connected to the power supply line at one terminal and to the input terminal of the circuit to be protected at the other terminal; and a second electrostatic discharge protection circuit including a second voltage drop circuit connected to the input terminal of the circuit to be protected at one terminal and to the ground line at the other terminal.

According to the first semiconductor integrated circuit device, when a negative surge is applied to the external input terminal while the power supply line is grounded, the surge flows from the power supply line to the external input terminal through the first voltage drop circuit and the first resistance. With this surge flow, the voltage of the input terminal of the circuit to be protected is reduced to a voltage divided (subjected to resistance division) with the first voltage drop circuit and the first resistance. Thus, the voltage applied to the input terminal of the circuit to be protected decreases. Likewise, when a positive surge is applied to the external input terminal while the ground line is grounded, the surge flows from the external input terminal to the ground line through the first resistance and the second voltage drop circuit. With this surge flow, the voltage of the input terminal of the circuit to be protected is reduced to a voltage divided (subjected to resistance division) with the first resistance and the second voltage drop circuit. Thus, the voltage applied to the input terminal of the circuit to be protected decreases. In this way, the voltage of the input terminal of the circuit to be protected can be made less likely to exceed the withstand voltage of the circuit to be protected even if a surge, positive or negative, is applied.

In the first semiconductor integrated circuit device, the first electrostatic discharge protection circuit preferably includes, as the first voltage drop circuit, at least one serially-connected first diode connected to the power supply line at an anode and to the input terminal of the circuit to be protected at a cathode.

In the first semiconductor integrated circuit device, the second electrostatic discharge protection circuit preferably includes, as the second voltage drop circuit, at least one serially-connected second diode connected to the input terminal of the circuit to be protected at an anode and to the ground line at a cathode.

The first semiconductor integrated circuit device preferably further includes: a third electrostatic discharge protection circuit connected to the power supply line at one terminal and to the external input terminal at the other terminal; and a fourth electrostatic discharge protection circuit connected to the external input terminal at one terminal and to the ground line at the other terminal.

In the above case, the third electrostatic discharge protection circuit preferably has a PMIS transistor that is connected to the power supply line at one terminal and to the external input terminal at the other terminal and whose gate is connected to the power supply line.

Further in the above case, the third electrostatic discharge protection circuit preferably has a second resistance connected to the power supply line at one terminal and to the gate of the PMIS transistor at the other terminal.

Preferably, the fourth electrostatic discharge protection circuit has an NMIS transistor that is connected to the external input terminal at one terminal and to the ground line at the other terminal and whose gate is connected to the ground line.

In the above case, the fourth electrostatic discharge protection circuit preferably has a third resistance connected to the ground line at one terminal and to the gate of the NMIS transistor at the other terminal.

Preferably, the third electrostatic discharge protection circuit has a third diode or a first thyristor connected to the power supply line at a cathode and to the external input terminal at an anode.

Preferably, the fourth electrostatic discharge protection circuit has a fourth diode or a second thyristor connected to the external input terminal at a cathode and to the ground line at an anode.

The second semiconductor integrated circuit device of the present invention includes: a circuit to be protected connected to an external input terminal; a first electrostatic discharge protection circuit connected to a power supply line at one terminal and to the external input terminal at the other terminal; a second electrostatic discharge protection circuit connected to the external input terminal at one terminal and to a ground line at the other terminal; a first resistance connected to the power supply line at one terminal and to a power supply input terminal of the circuit to be protected; and a third electrostatic discharge protection circuit including a first voltage drop circuit and connected to the power supply input terminal of the circuit to be protected at one terminal and electrically connected to the ground line at the other terminal.

According to the second semiconductor integrated circuit device, when a positive surge is applied to the external input terminal while the ground line is grounded, the surge flows from the external input terminal to the ground line via the first electrostatic discharge protection circuit, the first resistance and the first voltage drop circuit. With this surge flow, the voltage of the input terminal of the circuit to be protected is reduced to a voltage divided (subjected to resistance division) with the first electrostatic discharge protection circuit, the first resistance and the first voltage drop circuit. Thus, the voltage applied to the input terminal of the circuit to be protected decreases. Likewise, when a negative surge is applied to the external input terminal while the power supply line is grounded, the surge flows from the power supply line to the external input terminal via the first resistance, the first voltage drop circuit and the second electrostatic discharge protection circuit. With this surge flow, the voltage of the input terminal of the circuit to be protected is reduced to a voltage divided (subjected to resistance division) with the first resistance, the first voltage drop circuit and the second electrostatic discharge protection circuit. Thus, the voltage applied to the input terminal of the circuit to be protected decreases. In this way, the voltage of the input terminal of the circuit to be protected can be made less likely to exceed the withstand voltage of the circuit to be protected even if a surge, positive or negative, is applied.

The second semiconductor integrated circuit device preferably further includes a second resistance connected to a ground input terminal of the circuit to be protected at one terminal and to the ground line at the other terminal.

In the above case, the third electrostatic discharge protection circuit preferably includes, as the first voltage drop circuit, at least one serially-connected first diode connected to the power supply input terminal of the circuit to be protected at an anode and to the ground input terminal of the circuit to be protected at a cathode.

Further in the above case, the first voltage drop circuit preferably has at least two first diodes, and also has a second diode connected to an input terminal of the circuit to be protected at one terminal and to a node or one of nodes between the at least two first diodes at the other terminal.

In the case of having the second resistance, the third electrostatic discharge protection circuit preferably includes, as the first voltage drop circuit, a Zener diode connected to the power supply input terminal of the circuit to be protected at a cathode and to the ground input terminal of the circuit to be protected at an anode.

In the case of having the second resistance, preferably, the third electrostatic discharge protection circuit is connected to the ground line at the other terminal, and the device further includes a fourth electrostatic discharge protection circuit including a second voltage drop circuit and connected to the power supply line at one terminal and to the ground input terminal of the circuit to be protected at the other terminal.

In the above case, preferably, the third electrostatic discharge protection circuit includes, as the first voltage drop circuit, at least one serially-connected first diode connected to the power supply input terminal of the circuit to be protected at an anode and to the ground line at a cathode, and the fourth electrostatic discharge protection circuit includes, as the second voltage drop circuit, at least one serially-connected second diode connected to the power supply line at an anode and to the ground input terminal of the circuit to be protected at a cathode.

In the case of having the fourth electrostatic protection circuit, preferably, the third electrostatic discharge protection circuit includes, as the first voltage drop circuit, a first Zener diode connected to the power supply input terminal of the circuit to be protected at a cathode and to the ground line at an anode, and the fourth electrostatic discharge protection circuit includes, as the second voltage drop circuit, a second Zener diode connected to the power supply line at a cathode and to the ground input terminal of the circuit to be protected at an anode.

In the second semiconductor integrated circuit device, the first electrostatic discharge protection circuit preferably has a PMIS transistor that is connected to the power supply line at one terminal and to the external input terminal at the other terminal and whose gate is connected to the power supply line.

In the above case, the first electrostatic discharge protection circuit preferably has a third resistance connected to the power supply line at one terminal and to the gate of the PMIS transistor at the other terminal.

In the second semiconductor integrated circuit device, the second electrostatic discharge protection circuit preferably has an NMIS transistor that is connected to the external input terminal at one terminal and to the ground line at the other terminal and whose gate is connected to the ground line.

In the above case, the second electrostatic discharge protection circuit preferably has a fourth resistance connected to the ground line at one terminal and to the gate of the NMIS transistor at the other terminal.

In the second semiconductor integrated circuit device, the first electrostatic discharge protection circuit preferably has a third diode or a first thyristor connected to the power supply line at a cathode and to the external input terminal at an anode.

In the second semiconductor integrated circuit device, the second electrostatic discharge protection circuit preferably has a fourth diode or a second thyristor connected to the external input terminal at a cathode and to the ground line at an anode.

In the first semiconductor integrated circuit device, the circuit to be protected preferably includes: a PMIS transistor that is connected to the power supply line at one terminal and to an output terminal of the circuit to be protected at the other terminal and whose gate is connected to the input terminal of the circuit to be protected; and an NMIS transistor that is connected to the output terminal of the circuit to be protected at one terminal and to the ground line at the other terminal and whose gate is connected to the input terminal of the circuit to be protected.

In the second semiconductor integrated circuit device, in the case of having the second resistance, the circuit to be protected preferably includes: a PMIS transistor that is connected to the power supply input terminal of the circuit to be protected at one terminal and to an output terminal of the circuit to be protected at the other terminal and whose gate is connected to the input terminal of the circuit to be protected; and an NMIS transistor that is connected to the output terminal of the circuit to be protected at one terminal and to the ground input terminal of the circuit to be protected at the other terminal and whose gate is connected to the input terminal of the circuit to be protected.

As described above, according to the semiconductor integrated circuit device of the present invention, the voltage input into a circuit to be protected can be alleviated only when ESD is applied. Thus, it is possible to make the voltage input into the circuit to be protected lower than the withstand voltage of the gate insulating film of a MIS transistor, for example. In this way, a semiconductor integrated circuit device having an electrostatic discharge protection circuit satisfying the surge test standards can be obtained even though the semiconductor fabrication process (design rules) is further scaled down.

DESCRIPTION OF THE PREFERRED EMBODIMENTS

Embodiment 1

Embodiment 1 of the present invention will be described with reference to the relevant drawing.

Figure 1:
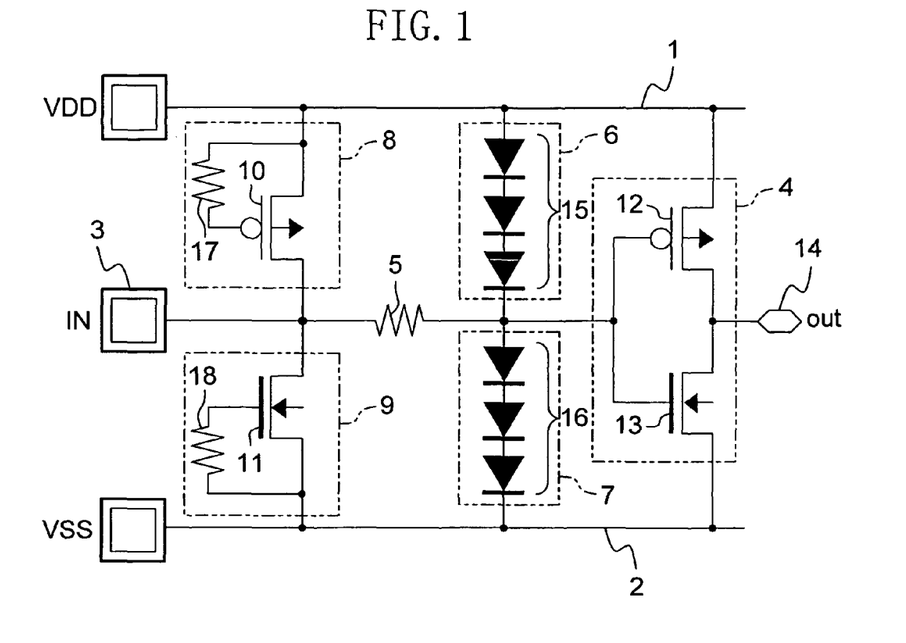
FIG. 1 is a circuit diagram of a semiconductor integrated circuit device of Embodiment 1 of the present invention.

FIG. 1 shows a circuit configuration of a semiconductor integrated circuit device of Embodiment 1 of the present invention. As shown in FIG. 1, the semiconductor integrated circuit device of Embodiment 1 includes: an input circuit 4 as a circuit to be protected, including an inverter that receives power supply from a power supply line 1 and a ground (GND) line 2 and is connected to an input pad 3 at its input terminal; a first resistance 5 connected to the input pad 3 at one terminal and to the input terminal of the input circuit 4 at the other terminal; a first electrostatic discharge (ESD) protection circuit 6 including a first voltage drop circuit 15 connected between the power supply line 1 and the input pad 3; and a second ESD protection circuit 7 including a second voltage drop circuit 16 connected between the input pad 3 and the GND line 2.

The semiconductor integrated circuit of Embodiment 1 further includes a third ESD protection circuit 8 connected to the power supply line 1 at one terminal and to the input pad 3 at the other terminal, and a fourth ESD protection circuit 9 connected to the input pad 3 at one terminal and to the GND line 2 at the other terminal.

The input circuit 4 has a PMIS transistor 12 whose source is connected to the power supply line 1, whose drain is connected to an output terminal 14 of the input circuit 4 and whose gate is connected to the input pad 3, and an NMIS transistor 13 whose source is connected to the GND line 2, whose drain is connected to the output terminal 14 of the input circuit 4 and whose gate is connected to the input pad 3.

The first voltage drop circuit 15 constituting the first ESD protection circuit 6 is composed of at least one stage of diode (three stages of diodes in the illustrated example) connected in series to the power supply line 1 at an anode and to the input terminal of the input circuit 4 at a cathode.

The second voltage drop circuit 16 constituting the second ESD protection circuit 7 is composed of at least one stage of diode (three stages of diodes in the illustrated example) connected in series to the input terminal of the input circuit 4 at an anode and to the GND line 2 at a cathode.

The third ESD protection circuit 8 includes a PMIS transistor 10 whose source is connected to the power supply line 1, whose drain is connected to the input pad 3 and whose gate is connected to the power supply line 1 via a third resistance 17.

The fourth ESD protection circuit 9 includes an NMIS transistor 11 whose source is connected to the GND line 2, whose drain is connected to the input pad 3 and whose gate is connected to the GND line 2 via a fourth resistance 18.

The third resistance 17 connected between the gate of the PMIS transistor 10 and the power supply line 1 and the fourth resistance 18 connected between the gate of the NMIS transistor 11 and the GND line 2 are provided to speed up transition from OFF state to ON state of parasitic bipolar transistors of the MIS transistors 10 and 11.

In Embodiment 1, when a positive surge is applied to the input pad 3 while the GND line 2 is grounded, the voltage input into the input circuit 4 can be alleviated (reduced) only during the application of ESD with the existence of the first resistance 5 and the second ESD protection circuit 7 placed between the input pad 3 and the input circuit 4. As a result, the positive voltage input into the input circuit 4 during the application of ESD can be reduced below the withstand voltage value of the gate oxide film of the NMIS transistor 13, and thus the gate oxide film of the NMIS transistor 13 in the input circuit 4 is prevented from being broken down.

Reversely, when a negative surge is applied to the input pad 3 while the power supply line 1 is grounded, the voltage input into the input circuit 4 can be alleviated only during the application of ESD with the existence of the first resistance 5 and the first ESD protection circuit 6 placed between the input pad 3 and the input circuit 4. As a result, the absolute value of the negative voltage input into the input circuit 4 during the application of ESD can be reduced below the withstand voltage value of the gate oxide film of the PMIS transistor 12, and thus the gate oxide film of the PMIS transistor 12 in the input circuit 4 is prevented from being broken down.

As described above, the semiconductor integrated circuit of Embodiment 1 has a feature of having the first resistance 5 and the first and second ESD protection circuits 6 and 7 that control the voltage applied to the gates of the MIS transistors 12 and 13 in the input circuit 4 in the case that a positive surge or a negative surge is applied to the input pad 3.

Hereinafter, the operation of the semiconductor integrated circuit device of Embodiment 1 will be described in more detail.

In an ESD test for the semiconductor integrated circuit device of Embodiment shown in FIG. 1 using a human body model (hereinafter, abbreviated as HBM), when a positive surge (for example, 2000 V) is applied to the input pad 3 while the GND line 2 is grounded, the voltage of the input terminal of the input circuit 4 rises with the rise of the potential of the input pad 3. In this regard, however, assuming that the built-in voltage of each of the three serially-connected diodes in the second ESD protection circuit 7 is 0.7 V, the second ESD protection circuit 7 will be turned ON if the potential of the input pad 3 exceeds 2.1 V, allowing a surge current to flow from the input pad 3 to the GND line 2 through the first resistance 5 and the second ESD protection circuit 7. With this flow of the surge current, the voltage applied to the input terminal of the input circuit 4 is reduced to a voltage divided from the voltage of the input pad 3 with the resistance value of the first resistance 5 and the ON resistance value of the second ESD protection circuit 7. For example, in the case that the voltage of the input pad 3 is clamped to 5 V with the fourth ESD protection circuit 9, the voltage applied to the input terminal of the input circuit 4 will be 2.5 V if the resistance value of the first resistance 5 is 100Ω and the ON resistance value of the second ESD protection circuit 7 is 100Ω.

Likewise, when a negative surge (for example, −2000 V) is applied to the input pad 3 while the power supply line 1 is grounded in an HBM ESD test, the voltage of the input terminal of the input circuit 4 drops with the drop of the potential of the input pad 3. In this regard, however, assuming that the built-in voltage of each of the three serially-connected diodes in the first ESD protection circuit 6 is 0.7 V, the first ESD protection circuit 6 will be turned ON if the potential of the input pad 3 drops below −2.1 V, allowing a surge current to flow from the power supply line 1 to the input pad 3 through the first ESD protection circuit 6 and the first resistance 5. With this flow of the surge current, the voltage applied to the input terminal of the input circuit 4 is reduced to a voltage divided from the voltage of the input pad 3 with the resistance value of the first resistance 5 and the ON resistance value of the first ESD protection circuit 6. For example, in the case that the voltage of the input pad 3 is clamped to −5 V with the first ESD protection circuit 6 and the first resistance 5, the voltage applied to the input terminal of the input circuit 4 will be −2.5 V if the resistance value of the first resistance 5 is 100Ω and the ON resistance value of the first ESD protection circuit 6 is 100Ω.

As described above, the input circuit 4 can be protected from a positive surge and a negative surge intruding from outside via the input pad 3 more reliably.

In Embodiment 1, the number of serially-connected diodes constituting each of the first and second ESD protection circuits 6 and 7 may be determined so as to reduce the leak current during normal operation. For example, if the maximum voltage applied to the input pad 3 is 1.2 V, two or three serially-connected diodes will be appropriate for each of the first and second ESD protection circuits 6 and 7 considering the built-in voltage of each diode. Note herein that the six diodes used in the first and second voltage drop circuits 15 and 16 are the same in electrical characteristics.

In Embodiment 1, the input circuit 4 including an inverter was used as the circuit to be protected from a surge. The input circuit 4 may not necessarily include an inverter, and the circuit to be protected may not necessarily be an input circuit.

The third and fourth ESD protection circuits 8 and 9 respectively including the PMIS transistor 10 and the NMIS transistor 11 may not necessarily be provided. However, placement of these ESD protection circuits 8 and 9 provides an effect of further improving the ESD resistance.

Alteration to Embodiment 1

An alteration to Embodiment 1 of the present invention will be described with reference to the relevant drawing.

Figure 2:
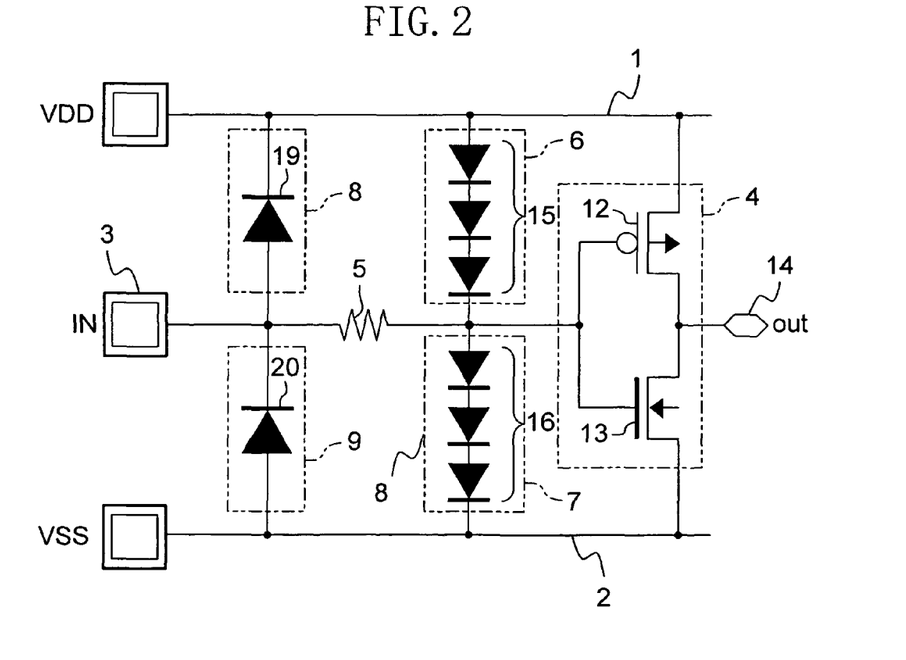
FIG. 2 is a circuit diagram of a semiconductor integrated circuit device of an alteration to Embodiment 1 of the present invention.

FIG. 2 shows a circuit configuration of a semiconductor integrated circuit device of the alteration to Embodiment 1. In FIG. 2, the same components as those shown in FIG. 1 are denoted by the same reference numerals, and the description thereof is omitted here.

As shown in FIG. 2, in the semiconductor integrated circuit device of this alteration, the third ESD protection circuit 8 is composed of a diode 19 whose cathode is connected to the power supply line 1 and whose anode is connected to the input pad 3, and the fourth ESD protection circuit 9 is composed of a diode 20 whose cathode is connected to the input pad 3 and whose anode is connected to the GND line 2.

Note herein that the diodes 19 and 20 are the same in electrical characteristics as the diodes in the first and second voltage drop circuits 15 and 16.

Hereinafter, the operation of the semiconductor integrated circuit device of this alteration will be described in detail.

In an ESD test using HBM, for example, for the semiconductor integrated circuit device shown in FIG. 2, when a positive surge (for example, 2000 V) is applied to the input pad 3 while the GND line 2 is grounded, the voltage of the input terminal of the input circuit 4 rises with the rise of the potential of the input pad 3. In this regard, however, assuming that the built-in voltage of each of the three serially-connected diodes in the second ESD protection circuit 7 is 0.7 V, the second ESD protection circuit 7 will be turned ON if the potential of the input pad 3 exceeds 2.1 V, allowing a surge current to flow from the input pad 3 to the GND line 2 through the first resistance 5 and the second ESD protection circuit 7. With this flow of the surge current, the voltage applied to the input terminal of the input circuit 4 is reduced to a voltage divided from the voltage of the input pad 3 with the resistance value of the first resistance 5 and the ON resistance value of the second ESD protection circuit 7. For example, in the case that the voltage of the input pad 3 is clamped to 5 V with the fourth ESD protection circuit 9, the voltage applied to the input terminal of the input circuit 4 will be 2.5 V if the resistance value of the first resistance 5 is 100Ω and the ON resistance of the second ESD protection circuit 7 is 100Ω.

Likewise, in an HBM ESD test, when a negative surge (for example, −2000 V) is applied to the input pad 3 while the power supply line 1 is grounded, the voltage of the input terminal of the input circuit 4 drops with the drop of the potential of the input pad 3. In this regard, however, assuming that the built-in voltage of each of the three serially-connected diodes in the first ESD protection circuit 6 is 0.7 V, the first ESD protection circuit 6 will be turned ON if the potential of the input pad 3 drops below −2.1 V, allowing a surge current to flow from the power supply line 1 to the input pad 3 through the first ESD protection circuit 6 and the first resistance 5. With this surge current, the voltage applied to the input terminal of the input circuit 4 is reduced to a voltage divided from the voltage of the input pad 3 with the resistance value of the first resistance 5 and the ON resistance value of the first ESD protection circuit 6. For example, in the case that the voltage of the input pad 3 is clamped to −5 V with the first ESD protection circuit 6 and the first resistance 5, the voltage applied to the input terminal of the input circuit 4 will be −2.5 V if the resistance value of the first resistance 5 is 100Ω and the ON resistance value of the first ESD protection circuit 6 is 100Ω.

As described above, the input circuit 4 can be protected from a positive surge and a negative surge intruding from outside via the input pad 3 more reliably.

Note that thyristors may be used in place of the diodes 19 and 20 respectively constituting the third and fourth ESD protection circuits 8 and 9.

Embodiment 2

Embodiment 2 of the present invention will be described with reference to the relevant drawing.

Figure 3:
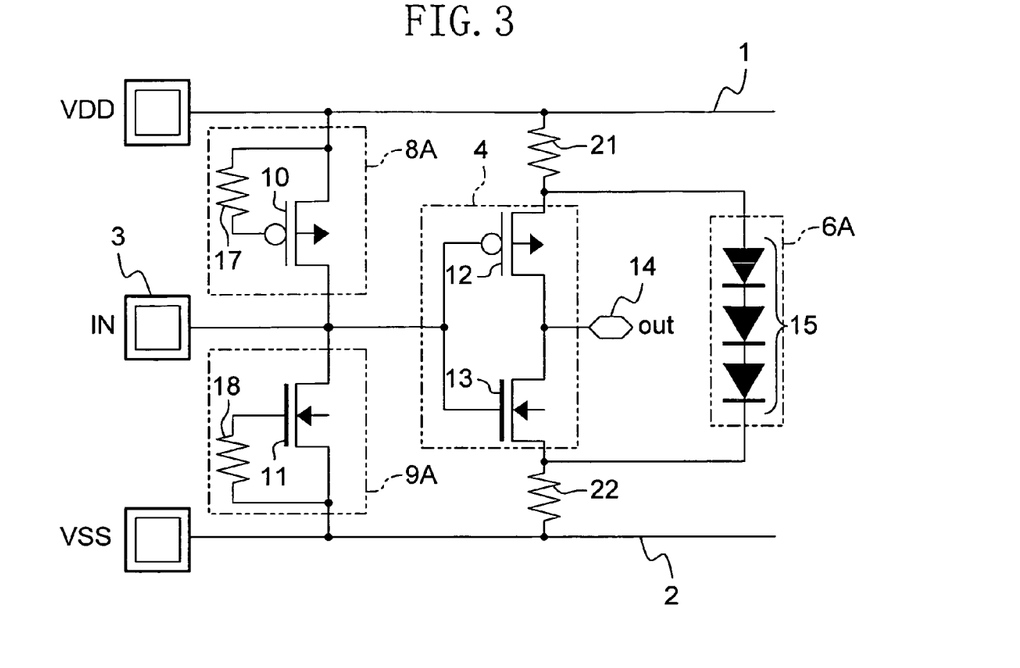
FIG. 3 is a circuit diagram of a semiconductor integrated circuit device of Embodiment 2 of the present invention.

FIG. 3 shows a circuit configuration of a semiconductor integrated circuit device of Embodiment 2 of the present invention. In FIG. 3, the same components as those shown in FIG. 1 are denoted by the same reference numerals, and the description thereof is omitted here.

As shown in FIG. 3, the semiconductor integrated circuit device of Embodiment 2 includes: an input circuit 4 connected to the input pad 3; a first ESD protection circuit 8A connected to the power supply line 1 at one terminal and to the input pad 3 at the other terminal; a second ESD protection circuit 9A connected to the input pad 3 at one terminal and to the GND line 2 at the other terminal; a first resistance 21 connected to the power supply line 1 at one terminal and to the power supply input terminal of the input circuit 4 at the other terminal; a second resistance 22 connected to the GND input terminal of the input circuit 4 at one terminal and to the GND line 2 at the other terminal; and a third ESD protection circuit 6A including a first voltage drop circuit 15 connected to the power supply input terminal of the input circuit 4 at one terminal and to the GND input terminal of the input circuit 4 at the other terminal.

As described above, the semiconductor integrated circuit of Embodiment 2 has a feature of having the first resistance 21, the third ESD protection circuit 6A including the first voltage drop circuit 15 composed of three serially-connected diodes and the second resistance 22, in addition to the first and second ESD protection circuits 8A and 9A.

With the configuration described above, when a positive surge is applied to the input pad 3 while the GND line 2 is grounded, the voltage of the GND input terminal of the input circuit 4 rises. It is therefore possible to reduce the potential difference between the input pad 3 and the GND input terminal of the input circuit 4, that is, the voltage applied to the gate insulating film of the NMIS transistor 13 in the input circuit 4 below the withstand voltage of the gate insulating film. In this way, the gate insulating film of the NMIS transistor 13 can be prevented from being broken down.

Reversely, when a negative surge is applied to the input pad 3 while the power supply line 1 is grounded, the voltage of the power supply input terminal of the input circuit 4 drops. It is therefore possible to reduce the potential difference between the input pad 3 and the power supply input terminal of the input circuit 4, that is, the voltage applied to the gate insulating film of the PMIS transistor 12 in the input circuit 4 below the withstand voltage of the gate insulating film. In this way, the gate insulating film of the PMIS transistor 12 can be prevented from being broken down.

As described above, by providing the first and second resistances 21 and 22 and the third ESD protection circuit 6A in addition to the conventional configuration, it is possible to drop the voltage applied to the gate of the PMIS transistor 12 or the NMIS transistor 13 in the input circuit 4 when a plus surge or a minus surge is applied to the input pad 3.

Hereinafter, the operation of the semiconductor integrated circuit device of Embodiment 2 will be described in detail.

In an ESD test using HBM, for example, for the semiconductor integrated circuit device shown in FIG. 3, when a positive surge (for example, 2000 V) is applied to the input pad 3 while the GND line 2 is grounded, the potential of the power supply line 1 rises with the rise of the potential of the input pad 3 via a parasitic diode of the PMIS transistor 10 constituting the first ESD protection circuit 8A. At this time, the voltage of the input terminal of the input circuit 4 also rises. In this regard, however, assuming that the built-in voltage of each of the three serially-connected diodes in the third ESD protection circuit 6A is 0.7 V and the built-in voltage of the parasitic diode of the PMIS transistor 10 is 0.7 V, the third ESD protection circuit 6A will be turned ON if the potential of the input pad 3 exceeds 2.8 V, allowing a surge current to flow from the input pad 3 to the GND line 2 through the parasitic diode of the PMIS transistor 10 of the first ESD protection circuit 8A, the first resistance 21, the third ESD protection circuit 6A and the second resistance 22. With this flow of the surge current, the voltage applied to the input terminal of the input circuit 4 is reduced to a voltage divided from the voltage of the input pad 3 with the ON resistance values of the PMIS transistor 10 and the third ESD protection circuit 6A and the resistance values of the first and second resistances 21 and 22. For example, in the case that the voltage of the input pad 3 is clamped to 5 V with the second ESD protection circuit 9A, the voltage applied to the input terminal of the input circuit 4 will be about 1.7 V if the resistance value of the first resistance 21 is 10Ω, the ON resistance value of the third ESD protection circuit 6A is 10Ω, and the resistance value of the second resistance 22 is 10Ω. Note that the ON resistance value of the parasitic diode of the PMIS transistor 10 that is very small is excluded from the calculation of the resistance division.

Likewise, in an HBM ESD test, when a negative surge (for example, −2000 V) is applied to the input pad 3 while the power supply line 1 is grounded, the potential of the GND line 2 drops with the drop of the potential of the input pad 3 via a parasitic diode of the NMIS transistor 11 constituting the second ESD protection circuit 9A. At this time, the voltage of the input terminal of the input circuit 4 also drops. In this regard, however, assuming that the built-in voltage of each of the three serially-connected diodes in the third ESD protection circuit 6A is 0.7 V and the built-in voltage of the parasitic diode of the NMIS transistor 11 is 0.7 V, the third ESD protection circuit 6A will be turned ON if the potential of the input pad 3 drops below −2.8 V, allowing a surge current to flow from the power supply line 1 to the input pad 3 through the first resistance 21, the third ESD protection circuit 6A, the second resistance 22 and the parasitic diode of the NMIS transistor 11 of the second ESD protection circuit 9A. With this surge current, the voltage applied to the input terminal of the input circuit 4 is reduced to a voltage divided from the voltage of the input pad 3 with the ON resistance values of the parasitic diode of the NMIS transistor 11 and the third ESD protection circuit 6A and the resistance values of the first and second resistances 21 and 22. For example, in the case that the voltage of the input pad 3 is clamped to −5 V with the first ESD protection circuit 8A, the voltage applied to the input terminal of the input circuit 4 will be −1.7 V if the ON resistance value of the third ESD protection circuit 6A is 10Ω, the resistance value of the first resistance 21 is 10Ω, and the resistance value of the second resistance 22 is 10Ω. Note that the ON resistance value of the parasitic diode of the NMIS transistor 11 that is very small is excluded from the calculation of the resistance division.

As described above, the input circuit 4 can be protected from a positive surge and a negative surge intruding from outside via the input pad 3 more reliably.

In Embodiment 2, the number of serially-connected diodes constituting the third ESD protection circuit 6A may be determined so as to reduce the leak current during normal operation. For example, if the maximum voltage applied to the input pad 3 is 1.2 V, two or three serially-connected diodes will be appropriate for the third ESD protection circuit 6A considering the built-in voltage of each diode.

A diode or a thyristor may be used in place of each of the PMIS transistor 10 constituting the first ESD protection circuit 8A and the NMIS transistor 11 constituting the second ESD protection circuit 9A.

In Embodiment 2, the input circuit 4 including an inverter was used as the circuit to be protected from a surge. The input circuit 4 may not necessarily include an inverter, and the circuit to be protected may not necessarily be an input circuit.

(First Alteration to Embodiment 2)

Figure 4:
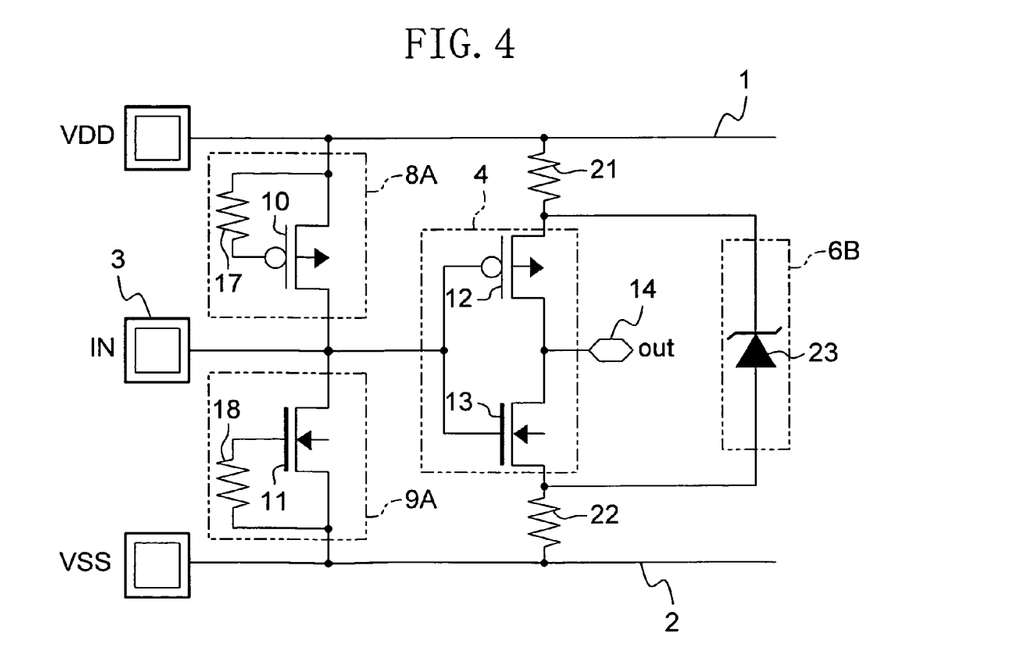
FIG. 4 is a circuit diagram of a semiconductor integrated circuit device of a first alteration to Embodiment 2 of the present invention.

A first alteration to Embodiment 2 of the present invention will be described with reference to the relevant drawing. FIG. 4 shows a circuit configuration of a semiconductor integrated circuit device of the first alteration to Embodiment 2. In FIG. 4, the same components as those shown in FIG. 3 are denoted by the same reference numerals, and the description thereof is omitted here.

As shown in FIG. 4, in this alteration, a Zener diode 23 is used in place of the diodes for the first voltage drop circuit constituting the third ESD protection circuit 6B.

As described above, by using the Zener diode 23 for the third ESD protection circuit 6B and setting the breakdown voltage of the Zener diode 23 at an appropriate value, it is possible to prevent occurrence of a leak current during normal operation without use of a plurality of diodes.

(Second Alteration to Embodiment 2)

Figure 5:
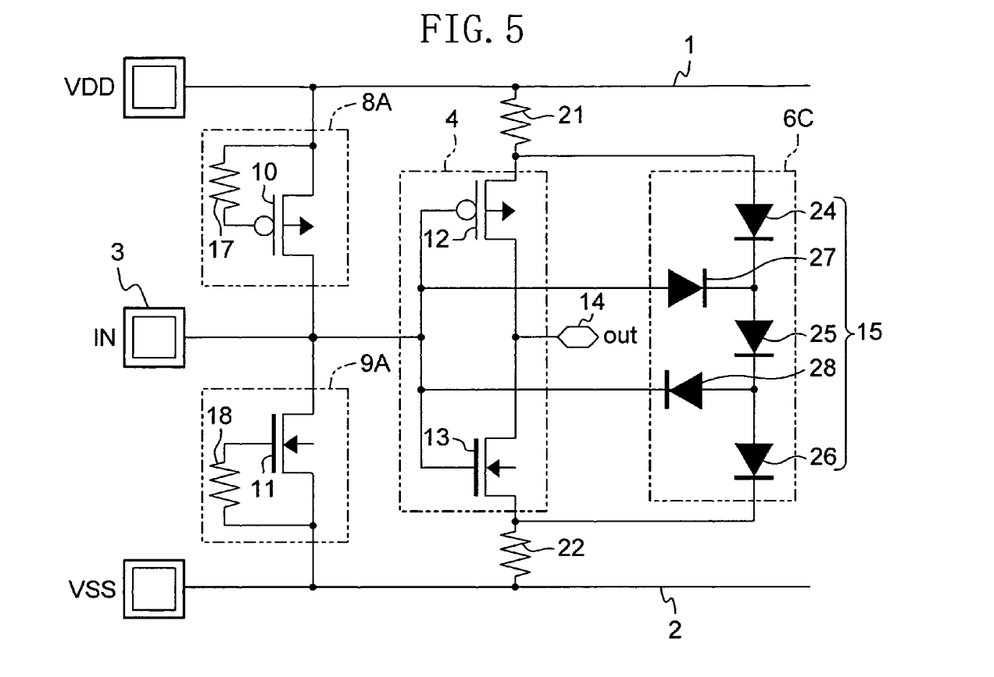
FIG. 5 is a circuit diagram of a semiconductor integrated circuit device of a second alteration to Embodiment 2 of the present invention.

A second alteration to Embodiment 2 of the present invention will be described with reference to the relevant drawing. FIG. 5 shows a circuit configuration of a semiconductor integrated circuit device of the second alteration to Embodiment 2. In FIG. 5, the same components as those shown in FIG. 3 are denoted by the same reference numerals, and the description thereof is omitted here.

As shown in FIG. 5, a third ESD protection circuit 6C in this alteration includes: first, second and third diodes 24, 25 and 26 serially connected between the power supply input terminal of the input circuit 4 and the GND input terminal of the input circuit 4; a fourth diode 27 whose anode is connected to the input pad 3 and whose cathode is connected to a first node between the first and second diodes 24 and 25; and a fifth diode 28 whose anode is connected to a second node between the second and third diodes 25 and 26 and whose cathode is connected to the input pad 3.

As described above, in the semiconductor integrated circuit device of the second alteration, also, as in the semiconductor integrated circuit device of Embodiment 2, by providing the first and second resistances 21 and 22 and the third ESD protection circuit 6C, it is possible to drop the voltage applied to the gate of the PMIS transistor 12 or the NMIS transistor 13 in the input circuit 4 when a plus surge or a minus surge is applied to the input pad 3.

The first and second resistances 21 and 22 and the third ESD protection circuit 6C are connected between the power supply line 1 and the GND line 2 between which the capacitance (parasitic capacitance) is comparatively large. The potentials of the power supply line 1 and the GND line 2 are therefore less likely to vary instantaneously in response to input of a plus surge or a minus surge.

In view of the above, in the second alteration, the third ESD protection circuit 6C includes the fourth and fifth diodes 27 and 28 connected to the input pad 3, in addition to the three serially-connected diodes 24, 25 and 26. With this arrangement, even if the potential of the input pad 3 widely varies with application of a surge, the absolute value of the potential of the input pad 3 becomes small because part of the surge current flows between the input pad 3 and the third ESD protection circuit 6C, and thus the input circuit 4 can be protected more reliably.

The detailed operation of the semiconductor integrated circuit device of this alteration is substantially the same as that described in Embodiment 2. In addition, in this alteration, with the fourth diode 27 whose anode is connected to the input pad 3 and the fifth diode 28 whose cathode is connected to the input pad 3, provided in the third ESD protection circuit 6C as described above, the input circuit 4 can be reliably protected from a positive surge or a negative surge intruding from outside via the input pad 3 irrespective of the capacitance between the power supply line 1 and the GND line 2.

Embodiment 3

Embodiment 3 of the present invention will be described with reference to the relevant drawing.

Figure 6:
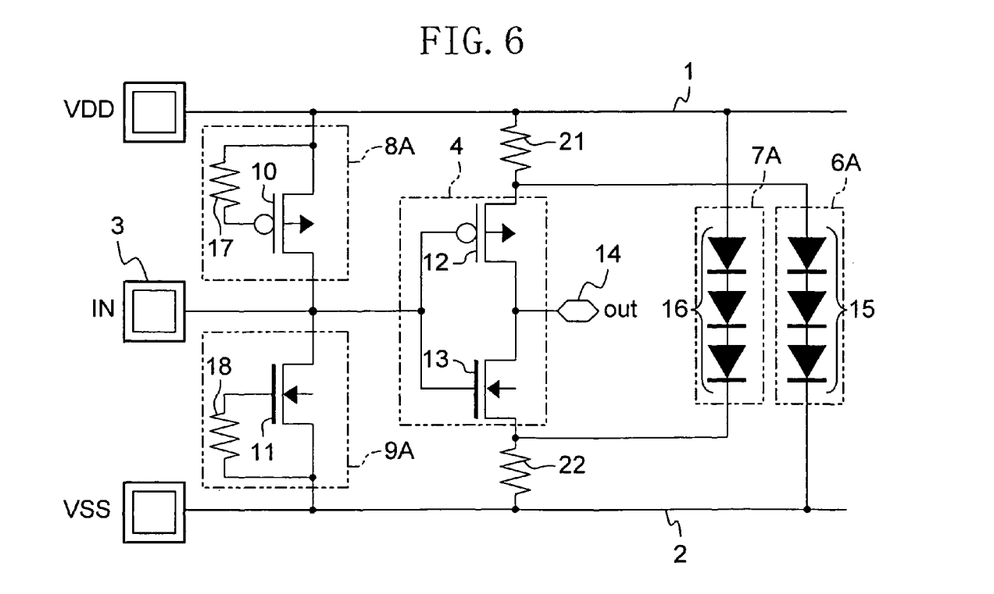
FIG. 6 is a circuit diagram of a semiconductor integrated circuit device of Embodiment 3 of the present invention.

FIG. 6 shows a circuit configuration of a semiconductor integrated circuit device of Embodiment 3 of the present invention. In FIG. 6, the same components as those shown in FIG. 3 are denoted by the same reference numerals, and the description thereof is omitted here.

As shown in FIG. 6, the semiconductor integrated circuit device of Embodiment 3 includes, in addition to the first and second ESD protection circuits 8A and 9A, a third ESD protection circuit 6A including a first voltage drop circuit 15 connected between the power supply input terminal of the input circuit 4 and the GND line 2 and a fourth ESD protection circuit 7A including a second voltage drop circuit 16 connected between the power supply line 1 and the GND input terminal of the input circuit 4.

The first voltage drop circuit 15 constituting the third ESD protection circuit 6A is composed of three stages of diodes connected in series to the power supply input terminal of the input circuit 4 at an anode and to the GND line 2 at a cathode.

The second voltage drop circuit 16 constituting the fourth ESD protection circuit 7A is composed of three stages of diodes connected in series to the power supply line 1 at an anode and to the GND input terminal of the input circuit 4 at a cathode.

In Embodiment 3, when a positive surge is applied to the input pad 3 while the GND line 2 is grounded, the voltage of the GND input terminal of the input circuit 4 rises due to the existence of the fourth ESD protection circuit 7A and the second resistance 22 placed between the power supply line 1 and the GND line 2. It is therefore possible to reduce the potential difference between the input pad 3 and the GND input terminal of the input circuit 4, that is, the voltage applied to the gate insulating film of the NMIS transistor 13 in the input circuit 4 below the withstand voltage of the gate insulating film of the NMIS transistor 13. As a result, the gate insulating film of the NMIS transistor 13 can be prevented from being broken down.

Reversely, when a negative surge is applied to the input pad 3 while the power supply line 1 is grounded, the voltage of the power supply input terminal of the input circuit 4 drops due to the existence of the first resistance 21 and the third ESD protection circuit 6A placed between the power supply line 1 and the GND line 2. It is therefore possible to reduce the potential difference between the input pad 3 and the power supply input terminal of the input circuit 4, that is, the voltage applied to the gate insulating film of the PMIS transistor 12 in the input circuit 4 to below the withstand voltage of the gate insulating film of the PMIS transistor 12. As a result, the gate insulating film of the PMIS transistor 12 in the input circuit 4 can be prevented from being broken down.

As described above, the semiconductor integrated circuit device of Embodiment 3 has a feature of having the first and second resistances 21 and 22 and the third and fourth ESD protection circuit 6A and 7A for controlling the voltages applied to the gates of the MIS transistors 12 and 13 in the input circuit 4.

Hereinafter, the operation of the semiconductor integrated circuit device of Embodiment 3 will be described in more detail.

In an ESD test using HBM, for example, for the semiconductor integrated circuit device shown in FIG. 6, when a positive surge (for example, 2000 V) is applied to the input pad 3 while the GND line 2 is grounded, the potential of the power supply line 1 rises with the rise of the potential of the input pad 3 via a parasitic diode of the PMIS transistor 10 constituting the first ESD protection circuit 8A. At this time, the voltage of the input terminal of the input circuit 4 also rises. In this regard, however, assuming that the built-in voltage of each of the three serially-connected diodes in the fourth ESD protection circuit 7A is 0.7 V and the built-in voltage of the parasitic diode of the PMIS transistor 10 is 0.7 V, the fourth ESD protection circuit 7A will be turned ON if the potential of the input pad 3 exceeds 2.8 V. This allows a surge current to flow from the input pad 3 to the GND line 2 through the parasitic diode of the PMIS transistor 10 constituting the first ESD protection circuit 8A, the fourth ESD protection circuit 7A and the second resistance 22. With this flow of the surge current, the voltage applied to the input terminal of the input circuit 4 is reduced to a voltage divided from the voltage of the input pad 3 with the ON resistance values of the PMIS transistor 10 and the fourth ESD protection circuit 7A and the resistance value of the second resistance 22. For example, in the case that the voltage of the input pad 3 is clamped to 5 V with the second ESD protection circuit 9A, the voltage applied to the input terminal of the input circuit 4 will be 2.5 V if the ON resistance value of the fourth ESD protection circuit 7A is 10Ω and the resistance value of the second resistance 22 is 10Ω. Note that the ON resistance value of the parasitic diode of the PMIS transistor 10 that is very small is excluded from the calculation of the resistance division.

Likewise, in an HBM ESD test, when a negative surge (for example, −2000 V) is applied to the input pad 3 while the power supply line 1 is grounded, the potential of the GND line 2 drops with the drop of the potential of the input pad 3 via a parasitic diode of the NMIS transistor 11 constituting the second ESD protection circuit 9A. At this time, the voltage of the input terminal of the input circuit 4 also drops. In this regard, however, assuming that the built-in voltage of each of the three serially-connected diodes in the third ESD protection circuit 6A is 0.7 V and the built-in voltage of the parasitic diode of the NMIS transistor 11 is 0.7 V, the third ESD protection circuit 6A will be turned ON if the potential of the input pad 3 drops below −2.8 V. This allows a surge current to flow from the power supply line 1 to the input pad 3 through the first resistance 21, the third ESD protection circuit 6A and the parasitic diode of the NMIS transistor 11 of the second ESD protection circuit 9A. With this surge current, the voltage applied to the input terminal of the input circuit 4 is reduced to a voltage divided from the voltage of the input pad 3 with the ON resistance values of the third ESD protection circuit 6A and the parasitic diode of the NMIS transistor 11 and the resistance value of the first resistance 21. For example, in the case that the voltage of the input pad 3 is clamped to −5 V with the first ESD protection circuit 8A, the voltage applied to the input terminal of the input circuit 4 will be −2.5 V if the ON resistance value of the third ESD protection circuit 6A is 10Ω and the resistance value of the first resistance 21 is 10Ω. Note that the ON resistance value of the parasitic diode of the NMIS transistor 11 that is very small is excluded from the calculation of the resistance division.

As described above, the input circuit 4 can be protected from a positive surge and a negative surge intruding from outside via the input pad 3 more reliably.

In Embodiment 3, the number of serially-connected diodes constituting each of the third and fourth ESD protection circuits 6A and 7A may be determined so as to reduce the leak current during normal operation. For example, if the maximum voltage applied to the input pad 3 is 1.2 V, two or three serially-connected diodes will be appropriate for each of the third and fourth ESD protection circuits 6A and 7A considering the built-in voltage of each diode.

In Embodiment 3, also, as in the first alteration to Embodiment 2, a Zener diode may be used in place of the diodes for each of the first and second voltage drop circuits 15 and 16 respectively constituting the third and fourth ESD protection circuit 6A and 7A.

Also, a diode or a thyristor may be used in place of each of the PMIS transistor 10 constituting the first ESD protection circuit 8A and the NMIS transistor 11 constituting the second ESD protection circuit 9A.

In Embodiment 3, the input circuit 4 including an inverter was used as the circuit to be protected from a surge. The input circuit 4 may not necessarily include an inverter, and the circuit to be protected may not necessarily be an input circuit.

As described above, according to the present invention, a semiconductor integrated circuit device having an electrostatic discharge protection circuit satisfying the surge test standards can be provided even though the design rules in the semiconductor fabrication process are further scaled down. In particular, the present invention is applicable to a semiconductor integrated circuit device having an electrostatic discharge protection circuit on its input side.

What is claimed is:

1. A semiconductor integrated circuit device comprising:
a circuit to be protected connected between a power supply line and a ground line;
a first resistance connected to an external input terminal at one terminal and to an input terminal of the circuit to be protected at the other terminal;
a first electrostatic discharge protection circuit including a first voltage drop circuit connected to the power supply line at one terminal and to the other terminal of the first resistance at the other terminal;
a second electrostatic discharge protection circuit including a second voltage drop circuit connected to the other terminal of the first resistance at one terminal and to the ground line at the other terminal;
the third electrostatic discharge protection circuit connected to the power supply line at one terminal and to the one terminal of the first resistance at the other terminal; and
a fourth electrostatic discharge protection circuit connected to the one terminal of the first resistance at one terminal and to the around line at the other terminal,
wherein the other terminal of the first electrostatic, discharge protection circuit and the one terminal of the second electrostatic discharge protection circuit are connected to the external input terminal through the first resistance, and
the first electrostatic discharge protection circuit includes, as the first voltage drop circuit, at least one first serially-connected diode connected to the power supply line at an anode and to the other terminal of the first resistance at a cathode.

2. The semiconductor integrated circuit device of claim 1, wherein the second electrostatic discharge protection circuit includes, as the second voltage drop circuit, at least one second serially-connected diode connected to the other terminal of the first resistance at an anode and to the ground line at a cathode.

3. The semiconductor integrated circuit device of claim 1, wherein the third electrostatic discharge protection circuit has a PMIS transistor that is connected to the power supply line at one terminal and to the one terminal of the first resistance at the other terminal and whose gate is connected to the power supply line.

4. The semiconductor integrated circuit device of claim 3, wherein the third electrostatic discharge protection circuit has a second resistance connected to the power supply line at one terminal and to the gate of the PMIS transistor at the other terminal.

5. The semiconductor integrated circuit device of claim 1, wherein the fourth electrostatic discharge protection circuit has an NMIS transistor that is connected to the one terminal of the first resistance at one terminal and to the ground line at the other terminal and whose gate is connected to the ground line.

6. The semiconductor integrated circuit device of claim 5, wherein the fourth electrostatic discharge protection circuit has a second resistance connected to the ground line at one terminal and to the gate of the NMIS transistor at the other terminal.

7. The semiconductor integrated circuit device of claim 1, wherein the third electrostatic discharge protection circuit has a third diode or a first thyristor connected to the power supply line at a cathode and to the one terminal of the first resistance at an anode.

8. The semiconductor integrated circuit device of claim 1, wherein the fourth electrostatic discharge protection circuit has a fourth diode or a second thyristor connected to the one terminal of the first resistance at a cathode and to the ground line at an anode.

9. The semiconductor integrated circuit device of claim 1, wherein the circuit to be protected includes:
a PMIS transistor that is connected to the power supply line at one terminal and to an output terminal of the circuit to be protected at the other terminal and whose gate is connected to the input terminal of the circuit to be protected; and
an NMIS transistor that is connected to the output terminal of the circuit to be protected at one terminal and to the ground line at the other terminal and whose gate is connected to the input terminal of the circuit to be protected.

10. The semiconductor integrated circuit device of claim 1, wherein the first serially-connected diode is a pn junction diode.

11. The semiconductor integrated circuit device of claim 2, wherein the second serially-connected diode is a pn junction diode.

12. A semiconductor integrated circuit device comprising:
a circuit to be protected connected to an external input terminal;

a first electrostatic discharge protection circuit connected to a power supply line at one terminal and to the external input terminal at the other terminal;

a second electrostatic discharge protection circuit connected to the external input terminal at one terminal and to a ground line at the other terminal;

a first resistance connected to the power supply line at one terminal and to a power supply input terminal of the circuit to be protected;

a second resistance connected to a ground input terminal of the circuit to be protected at one terminal and to the ground line at the other terminal; and a third electrostatic discharge protection circuit including a first voltage drop circuit and connected to the power supply input terminal of the circuit to be protected at one terminal and electrically connected to the ground line at the other terminal, wherein the third electrostatic discharge protection circuit has, as the first voltage drop circuit, at least two serially-connected first diodes connected to the power supply input terminal of the circuit to be protected at an anode and to the ground input terminal of the circuit to be protected at a cathode, and also has a second diode connected to an input terminal of the circuit to be protected at one terminal and to a node or one of nodes between the at least two first diodes at the other terminal.

13. The semiconductor integrated circuit device of claim 12, wherein the first and second serially-connected diodes are pn junction diodes.

14. A semiconductor integrated circuit device comprising:
a circuit to be protected connected to an external input terminal;

a first electrostatic discharge protection circuit connected to a power supply line at one terminal and to the external input terminal at the other terminal;

a second electrostatic discharge protection circuit connected to the external input terminal at one terminal and to a ground line at the other terminal;

a first resistance connected to the power supply line at one terminal and to a power supply input terminal of the circuit to be protected;

a second resistance connected to a ground input terminal of the circuit to be protected at one terminal and to the ground line at the other terminal; and a third electrostatic discharge protection circuit including a first voltage drop circuit and connected to the power supply input terminal of the circuit to be protected at one terminal and electrically connected to the ground line at the other terminal, wherein the third electrostatic discharge protection circuit includes, as the first voltage drop circuit, a Zener diode connected to the power supply input terminal of the circuit to be protected at a cathode and to the ground input terminal of the circuit to be protected at an anode.

15. A semiconductor integrated circuit device comprising:
a circuit to be protected connected to an external input terminal;

a first electrostatic discharge protection circuit connected to a power supply line at one terminal and to the external input terminal at the other terminal;

a second electrostatic discharge protection circuit connected to the external input terminal at one terminal and to a ground line at the other terminal;

a first resistance connected to the power supply line at one terminal and to a power supply input terminal of the circuit to be protected;

a second resistance connected to a ground input terminal of the circuit to be protected at one terminal and to the ground line at the other terminal; and a third electrostatic discharge protection circuit including a first voltage drop circuit and connected to the power supply input terminal of the circuit to be protected at one terminal and electrically connected to the ground line at the other terminal, wherein the third electrostatic discharge protection circuit is connected to the ground line at the other terminal, and the device further comprises a fourth electrostatic discharge protection circuit including a second voltage drop circuit and connected to the power supply line at one terminal and to the ground input terminal of the circuit to be protected at the other terminal.

16. The semiconductor integrated circuit device of claim 15, wherein the third electrostatic discharge protection circuit includes, as the first voltage drop circuit, at least one serially-connected first diode connected to the power supply input terminal of the circuit to be protected at an anode and to the ground line at a cathode, and the fourth electrostatic discharge protection circuit includes, as the second voltage drop circuit, at least one serially-connected second diode connected to the power supply line at an anode and to the ground input terminal of the circuit to be protected at a cathode.

17. The semiconductor integrated circuit device of claim 16, wherein the first and second serially-connected diodes are pn junction diodes.

18. The semiconductor integrated circuit device of claim 15, wherein the third electrostatic discharge protection circuit includes, as the first voltage drop circuit, a first Zener diode connected to the power supply input terminal of the circuit to be protected at a cathode and to the ground line at an anode, and the fourth electrostatic discharge protection circuit includes, as the second voltage drop circuit, a second Zener diode connected to the power supply line at a cathode and to the ground input terminal of the circuit to be protected at an anode.

19. The semiconductor integrated circuit device of claim 15, wherein the first electrostatic discharge protection circuit has a PMIS transistor that is connected to the power supply line at one terminal and to the external input terminal at the other terminal and whose gate is connected to the power supply line.

20. The semiconductor integrated circuit device of claim 19, wherein the first electrostatic discharge protection circuit has a third resistance connected to the power supply line at one terminal and to the gate of the PMIS transistor at the other terminal.

21. The semiconductor integrated circuit device of claim 15, wherein the second electrostatic discharge protection circuit has an NMIS transistor that is connected to the external input terminal at one terminal and to the ground line at the other terminal and whose gate is connected to the ground line.

22. The semiconductor integrated circuit device of claim 21, wherein the second electrostatic discharge protection circuit has a fourth resistance connected to the ground line at one terminal and to the gate of the NMIS transistor at the other terminal.

23. The semiconductor integrated circuit device of claim 15, wherein the first electrostatic discharge protection circuit has a diode or a thyristor connected to the power supply line at a cathode and to the external input terminal at an anode.

24. The semiconductor integrated circuit device of claim 15, wherein the second electrostatic discharge protection circuit has a diode or a thyristor connected to the external input terminal at a cathode and to the ground line at an anode.

25. The semiconductor integrated circuit device of claim 15, wherein the circuit to be protected includes:
- a PMIS transistor that is connected to the power supply input terminal of the circuit to be protected at one terminal and to an output terminal of the circuit to be protected at the other terminal and whose gate is connected to the input terminal of the circuit to be protected; and
- an NMIS transistor that is connected to the output terminal of the circuit to be protected at one terminal and to the ground input terminal of the circuit to be protected at the other terminal and whose gate is connected to the input terminal of the circuit to be protected.

* * * * *